United States Patent
Shih et al.

(10) Patent No.: US 9,153,389 B2
(45) Date of Patent: Oct. 6, 2015

(54) CARBON NANOTUBE-GRAPHENE COMPOSITE, METHOD OF FORMING THE SAME, AND ELECTRONIC DEVICE

(71) Applicant: National Taiwan University of Science and Technology, Taipei (TW)

(72) Inventors: Yi-Ting Shih, New Taipei (TW); Ying-Sheng Huang, New Taipei (TW); Kuei-Yi Lee, Taipei (TW)

(73) Assignee: National Taiwan University of Science and Technology, Taipei (TW)

( * ) Notice: Subject to any disclaimer, the term of this patent is extended or adjusted under 35 U.S.C. 154(b) by 226 days.

(21) Appl. No.: 13/928,377

(22) Filed: Jun. 27, 2013

(65) Prior Publication Data

US 2015/0004373 A1   Jan. 1, 2015

(51) Int. Cl.
*H01G 11/36* (2013.01)
*B32B 3/10* (2006.01)
*H01G 11/24* (2013.01)
*H01G 11/26* (2013.01)
*H01G 11/32* (2013.01)
*H01G 11/86* (2013.01)

(52) U.S. Cl.
CPC *H01G 11/36* (2013.01); *B32B 3/10* (2013.01); *H01G 11/24* (2013.01); *H01G 11/26* (2013.01); *H01G 11/32* (2013.01); *H01G 11/86* (2013.01); *Y10T 428/24802* (2015.01)

(58) Field of Classification Search
CPC ............... Y10T 428/24802; Y10T 428/24851; Y10T 428/24917; B82Y 30/00; B82Y 40/00; B32B 3/10; H01G 11/36; H01G 9/0029
See application file for complete search history.

(56) References Cited

U.S. PATENT DOCUMENTS

| 7,687,308 | B2 | 3/2010 | Parikh et al. | |
| 8,007,875 | B2 * | 8/2011 | Yoon et al. | 427/577 |
| 8,808,860 | B2 * | 8/2014 | Kim et al. | 428/408 |
| 2008/0090183 | A1 * | 4/2008 | Zhu et al. | 430/324 |
| 2010/0038627 | A1 | 2/2010 | Parikh et al. | |
| 2010/0133512 | A1 | 6/2010 | Parikh et al. | |
| 2012/0121891 | A1 * | 5/2012 | Kim et al. | 428/323 |

FOREIGN PATENT DOCUMENTS

TW   201247921   12/2012
WO   WO 2011037388 A2 * 3/2011

OTHER PUBLICATIONS

Lee et al. "Versatile Carbon Hybrid Films Composed of Vertical Carbon Nanotubes grown on Mechanically Compliant Graphene Films", Adv. Mat. 2010, vol. 22, p. 1247-1252.*
Shih et al., "Electrochemical capacitor characteristics of IrO2 and RuO2 nanostructures coated onto carbon nanotubes grown on graphene-based substrate," Master's thesis, Jul. 11, 2012, National Taiwan University of Science and Technology.
Lin et al, "Super capacitive characteristics of RuO2 nanorods grown on carbon nanotubes," Applied Surface Science 256, Nov. 30, 2009, pp. 1042-1045.

* cited by examiner

*Primary Examiner* — Gerard Higgins
(74) *Attorney, Agent, or Firm* — Jianq Chyun IP Office

(57) ABSTRACT

Provided is a carbon nanotube-graphene composite comprising a substrate, a graphene layer disposed on the substrate, and a patterned layer of aligned carbon nanotubes disposed on the graphene layer.

4 Claims, 7 Drawing Sheets

CARBON NANOTUBE-GRAPHENE COMPOSITE, METHOD OF FORMING THE SAME, AND ELECTRONIC DEVICE

BACKGROUND

1. Technical Field

The present invention relates to a carbon nanotube-graphene composite, and more particularly, to a carbon nanotube-graphene composite having a patterned layer of aligned carbon nanotubes formed on a graphene layer.

2. Description of Related Art

Global warming and petroleum crisis have become pressing issues to human sustainability and stimulated numerous attempts to seek for mitigation. Researches addressing these concerns may be divided into several categories: exploiting alternative energy resources, developing energy scavenging technology to harvest the waste work in our daily life, or constructing more efficient energy storage devices. The last one, at present, focuses much on the field of "supercapacitor," which generally refers to two distinct types of capacitor, that is, the electrical double-layer capacitors (EDLC) and the pseudocapacitors. The former operates by the separation of charge in a Helmholtz double layer at the interface between the surface of a conductor electrode and an electrolytic solution electrolyte; the latter utilizes the redox reactions electrosorbtion or intercalation on the surface of the electrode.

With regard to the electrical double-layer capacitors, since the capacitance value is determined by charges adsorbed on the surface of the electrode, materials with high specific surface area have become prominent candidates. Of these, vertically aligned carbon nanotube array drew much attention. However, the bonding strength between the vertically aligned carbon nanotubes and the underlying substrate is often weak, and the carbon nanotubes may be peeled off from the substrate after a limited number of charge and discharge cycles.

SUMMARY

The present invention provides a carbon nanotube-graphene composite including a substrate, a graphene layer disposed on the substrate, and a patterned layer of aligned carbon nanotubes disposed on the graphene layer.

In an embodiment, the patterned layer of aligned carbon nanotubes includes a plurality of bundles of aligned carbon nanotubes.

In an embodiment, the plurality of bundles of aligned carbon nanotubes are disposed on the graphene layer in a regular form.

In an embodiment, the patterned layer of aligned carbon nanotubes is a layer of aligned carbon nanotubes with a plurality of hollow portions formed therein.

In an embodiment, the plurality of hollow portions are disposed on the graphene layer in a regular form.

In an embodiment, the carbon nanotube-graphene composite further includes a layer of a pseudocapacitive material disposed on the surface of the patterned layer of aligned carbon nanotubes.

In an embodiment, the layer of the pseudocapacitive material includes nanostructures of the pseudocapacitive material.

In an embodiment, the substrate has a non-planar surface and the graphene layer is disposed conformally on the non-planar surface.

The present invention also provides a method of forming a carbon nanotube-graphene composite including the following steps. First, a graphene layer is provided on a substrate. Then, a patterned layer of aligned carbon nanotubes is formed on the graphene layer.

In an embodiment, the formation of the pattern layer of aligned carbon nanotubes includes the following steps. A photoresist layer is formed on the graphene layer. Then, the photoresist layer is patterned to form a patterned photoresist layer, wherein the patterned photoresist layer covers a first portion of the graphene layer and exposes a second portion of graphene layer. Afterwards, aligned carbon nanotubes are grew on the second portion of the graphene layer.

In an embodiment, the method of forming a carbon nanotube-graphene composite further includes forming a catalyst layer on the graphene layer after patterning the photoresist layer and before growing the aligned carbon nanotubes.

In an embodiment, the method of forming a carbon nanotube-graphene composite further includes forming a buffer layer on the graphene layer after patterning the photoresist layer and before forming the catalyst layer on the graphene layer.

In an embodiment, the method of forming a carbon nanotube-graphene composite further includes forming a pseudocapacitive material on the surface of the patterned layer of aligned carbon nanotubes.

The present invention further provides an electronic device, wherein an electrode of the electronic device includes the carbon nanotube-graphene composite described above.

In order to make the aforementioned and other objects, features and advantages of the present invention comprehensible, several non-limiting embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

As discussed in the BACKGROUND section, there is a problem regarding to the insufficient bonding strength between the aligned carbon nanotube array and the underlying substrate. In addition, the inventors have unexpectedly found that, in spite of the extremely large specific surface area of the carbon nanotubes, the high surface tension at the sidewall of the carbon nanotube and the narrow spacing between the individual carbon nanotubes in an aligned carbon nanotube array can make it very difficult for the electrolyte solution to fill into the space between the individual carbon nanotubes. As a result, the surface area of carbon nanotubes is not fully utilized. The inventors have addressed this issue by patterning the aligned carbon nanotube array to increase the "effective" specific surface area and providing a graphene layer between the substrate and the aligned carbon nanotube array to improve the adhesion characteristics. Embodiments and more details of this inventive concept are illustrated below with the accompanying figures. Several other examples of the present invention can be found in Shih, Yi-Ting, "Electrochemical capacitor characteristics of $IrO_2$ and $RuO_2$ nanostructures coated onto carbon nanotubes grown on graphene-based substrate," MS thesis, National Taiwan University of Science and Technology (11 Jul. 2012), the entire content of which is incorporated herein by reference.

Figure 1A:
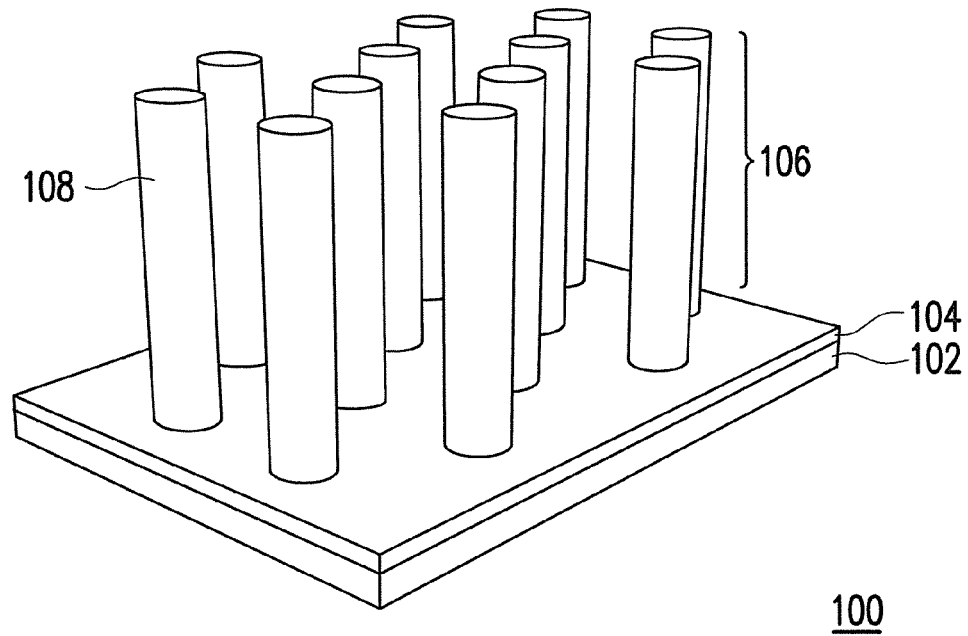
FIG. 1A illustrates a carbon nanotube-graphene composite according to the first embodiment of the present invention.
Figure 1B:
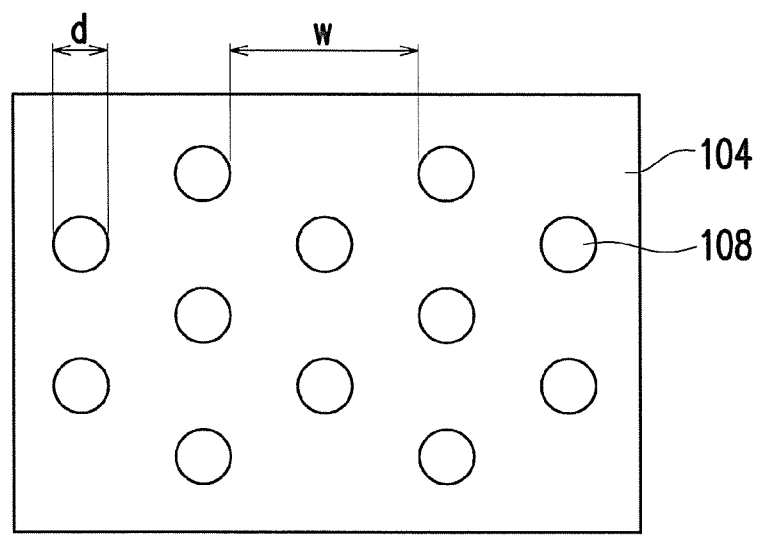
FIG. 1B is a top view of the carbon nanotube-graphene composite of FIG. 1A.

FIG. 1A illustrates a carbon nanotube-graphene composite according to the first embodiment of the present invention. FIG. 1B shows the top view of FIG. 1A.

Referring to FIG. 1A, the first embodiment of the present invention provides a carbon nanotube-graphene composite 100, which includes a substrate 102, a graphene layer 104, and a patterned layer 106 of aligned carbon nanotubes.

If the graphene layer 104 is formed directly on the substrate 102, it is preferred that the substrate 102 includes copper (Cu), nickel (Ni), or silicon carbide (SiC), for example. The graphene layer 104 can also be formed on substrate 102 and then transferred onto another substrate (not shown) by any conventional technique; in this case, the material of the "another substrate" is not particularly limited.

The graphene layer 104 includes a plurality of nano-sheets (not shown), each of which are composed of one to ten of flat monolayers of close-packed carbon atoms. The graphene layer 104 can be typically formed by a chemical vapor deposition (CVD) process with, for example, $CH_4$ or $C_2H_2$ as the carbon source.

The graphene layer 104 can be formed into a very thin layer, typically 1.7-5.1 nm in thickness. Thus, it can be formed conformally and uniformly on the substrate 102 even if the substrate 102 has a non-planar surface. Further, the similarity of the constituent atom and the bonding structure (i.e., the $sp^2$ hybridization) between the graphene layer 104 and the subsequent patterned layer 106 of aligned carbon nanotubes provides a better adhesion characteristic between the carbon nanotubes and the substrate 102. Consequently, when the carbon nanotube-graphene composite 100 is used as an electrode in an electronic device such as a supercapacitor or a secondary battery, it can withstand a large number of charge and discharge cycles without the carbon nanotubes peeling off from the substrate 102.

The patterned layer 106 consists of a plurality of bundles 108's of aligned carbon nanotubes and each of the bundles 108's consists of a plurality of vertically aligned carbon nanotubes. The axial directions of the carbon nanotubes in the bundles 108's are substantially perpendicular to the surface of the graphene layer 104.

The carbon nanotubes in the bundles 108's can be single-walled or multi-walled carbon nanotubes, depending on the process parameters such as catalyst type. Multi-walled carbon nanotubes may be preferred in some application scenario, in consideration of the better electrical conductivity as compared to the single-walled carbon nanotubes. The diameter and the length of the carbon nanotubes can be 20-40 nm and 1-500 μm, respectively. The area density of carbon nanotube in the bundles 108's is typically $10^8$-$10^9$/cm$^2$.

In FIG. 1A, the plurality of bundles 108's of aligned carbon nanotubes are disposed on the graphene layer 104 in a regular form, i.e., the bundles 108's each have an approximately identical diameter d and are spaced apart by a fixed spacing w, as more clearly shown in FIG. 1B. The diameter d of a bundle 108 and the spacing w between two of the bundles 108's are not particularly limited, and can be suitably adjusted to achieve the largest effective specific surface area. For example, design of the photomask used in the patterning process defining the growth position of aligned carbon nanotubes can be changed. In some embodiments, the diameter d of a bundle 108 of the aligned carbon nanotubes is larger than 2 μm, and the spacing w between two of the bundles 108's is larger than 2 μm. Preferably, the diameter d of a bundle 108 of the aligned carbon nanotubes is 10-25 μm, and the spacing w between two of the bundles 108's is 5-10 μm.

In FIGS. 1A and 1B, the bundles 108's of aligned carbon nanotubes are disposed on the graphene layer 104 in a hexagonal array. The present invention, however, is not limited thereto. The patterned layer of aligned carbon nanotubes can consist of bundles of aligned carbon nanotubes arranged in any other regular form or arranged in an irregular form.

Figure 1C:
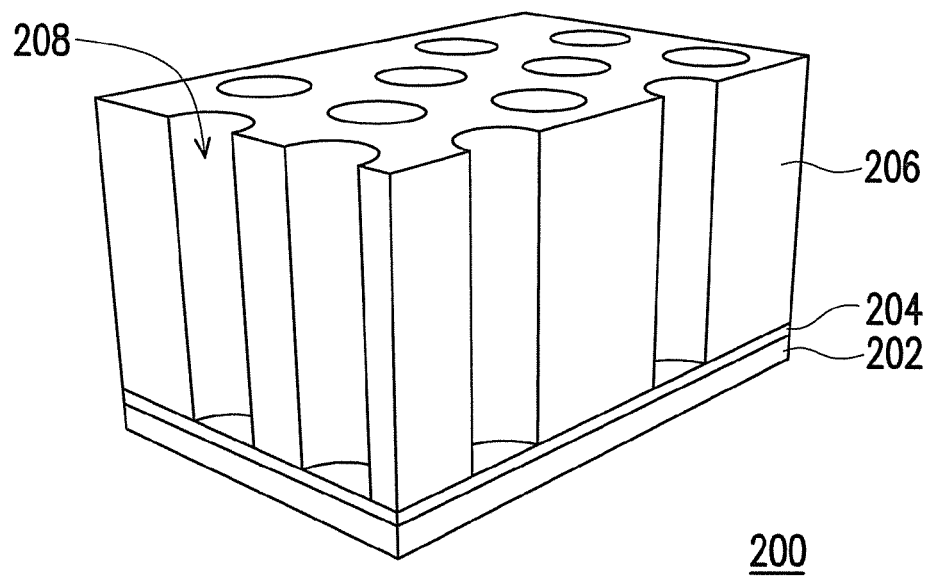
FIG. 1C illustrates a carbon nanotube-graphene composite according to the second embodiment of the present invention.

FIG. 1C illustrates a carbon nanotube-graphene composite according to the second embodiment of the present invention.

Referring to FIG. 1C, the carbon nanotube-graphene composite 200 includes a substrate 202, a graphene layer 204, and a patterned layer 206 of aligned carbon nanotubes. The patterned layer 206 in this embodiment is a layer of aligned carbon nanotubes with a plurality of hollow portions 208's formed therein. Carbon nanotubes in the patterned layer 206 have an axial direction substantially perpendicular to the surface of the graphene layer 204. The diameter and length of the carbon nanotubes in the patterned layer 206 can be similar to those described in connection to the first embodiment. The hollow portions 208's shown in FIG. 1C are disposed on the graphene layer 204 in a regular form. The present invention, however, is not limited thereto. In other embodiments, the hollow portions can be arranged in any regular or irregular form.

Figure 1D:
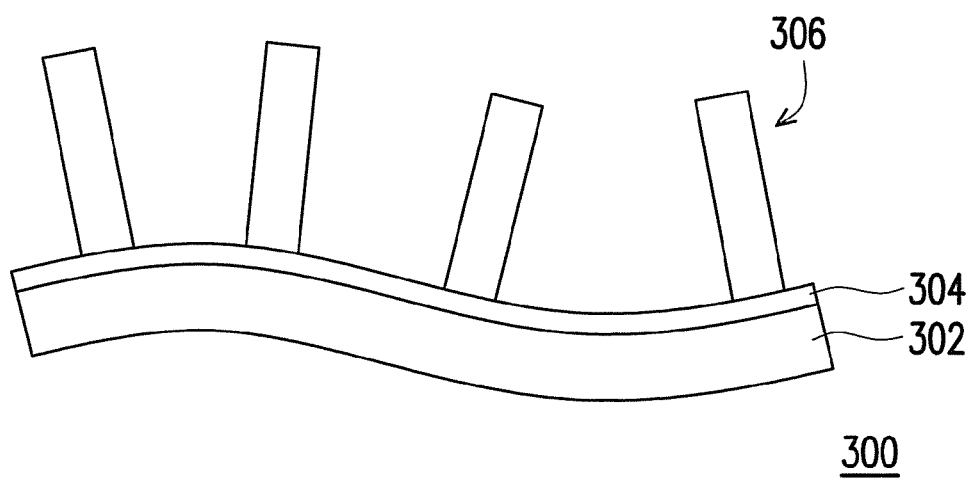
FIG. 1D illustrates the cross-sectional view of a carbon nanotube-graphene composite according to the third embodiment of the present invention.

FIG. 1D illustrates the cross-sectional view of a carbon nanotube-graphene composite according the third embodiment of the present invention. Note that the graphene layer 304 is disposed conformally and uniformly on the non-planar surface of the substrate 302.

Figure 2A:
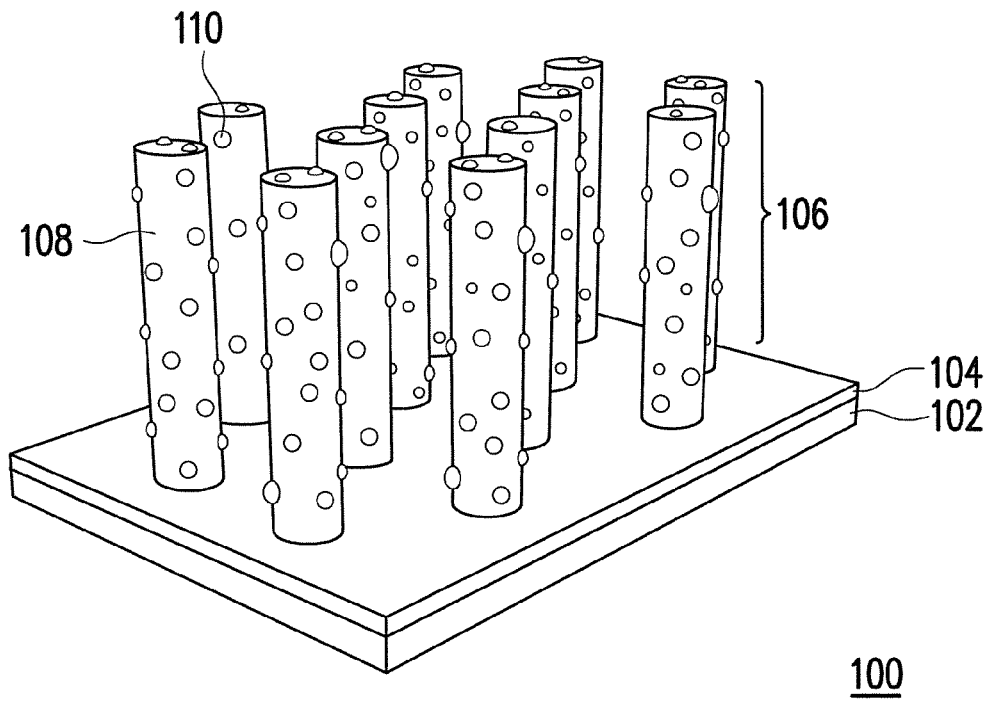
FIG. 2A illustrates a carbon nanotube-graphene composite according to the fourth embodiment of the present invention.
Figure 2B:
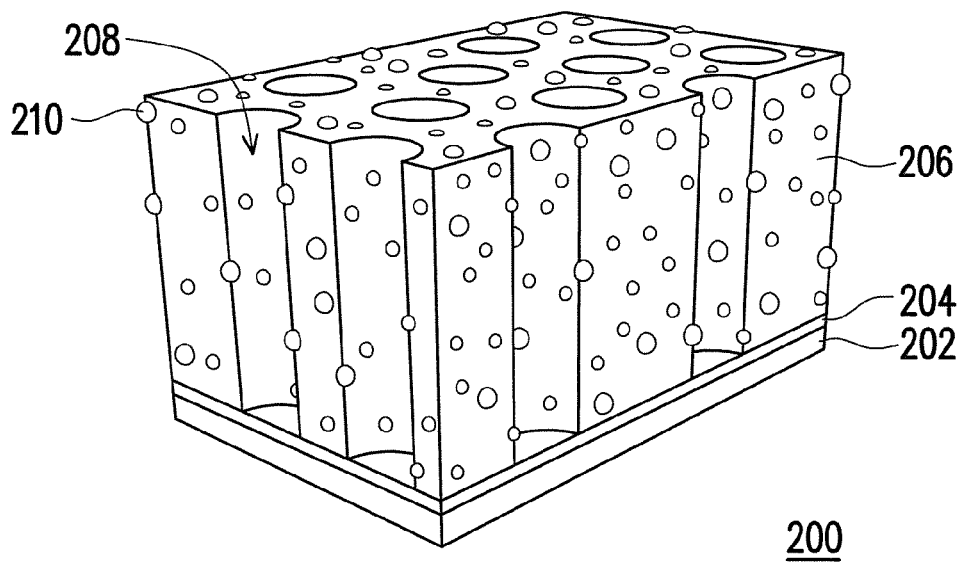
FIG. 2B illustrates a carbon nanotube-graphene composite according to the fifth embodiment of the present invention.

FIGS. 2A and 2B illustrate two carbon nanotube-graphene composites according to the fourth and fifth embodiments of the present invention.

Referring to FIG. 2A, the carbon nanotube-graphene composite of the fourth embodiment is similar to that of the first embodiment, except that a layer of pseudocapacitive material is disposed on the patterned layer 106 of aligned carbon nanotubes. The layer of the pseudocapacitive material in FIG. 2A is shown as a layer of nano-particles 110's. In other embodiments, the layer of the pseudocapacitive material can also includes other nanostructures of the pseudocapacitive material, such as nano-foil, nano-rod, nano-fiber, nano-flake, nano-sheet, or nano-needle.

Similarly, the carbon nanotube-graphene composite of the fifth embodiment (FIG. 2B) is identical to that of the second embodiment, except that a layer of nanoparticles 210's of pseudocapacitive material is disposed on the patterned layer 206 of aligned carbon nanotubes.

The pseudocapacitive material is not particularly limited as long as it exhibits pseudocapacitive property. A typical choice is the oxide of the transition metal, such as $RuO_2$, $IrO_2$, $NiO_x$, $Co_3O_4$, or $MnO_2$. With the formation of the pseudocapacitive material on the surface of the patterned layer (106 or 206) of aligned carbon nanotubes, the electrochemical characteristics of the carbon nanotube-graphene composites can be significantly improved, as will be evinced in the Experimental section.

FIGS. 3A-3G illustrate a process of forming a carbon nanotube-graphene composite according the sixth embodiment of the present invention.

Figure 3A:
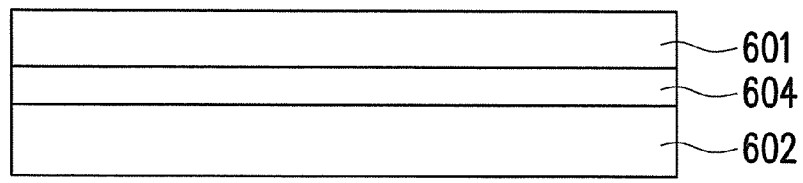
FIGS. 3A-3G illustrate a process of forming a carbon nanotube-graphene composite according the sixth embodiment of the present invention.

Referring to FIG. 3A, a substrate 602 is provided, wherein a graphene layer 604 is provided on the substrate 602. The substrate 602 can include Cu, Ni, or SiC foil. The graphene layer 604 can be formed directly on the substrate 602. A photoresist layer 601 is formed on the graphene layer 604 by, for example, a spin-coating technique. The photoresist layer 601 can include positive photoresist material or negative photoresist material. In the following description, it is presumed that the photoresist layer 601 is composed of positive photoresist material.

Figure 3B:
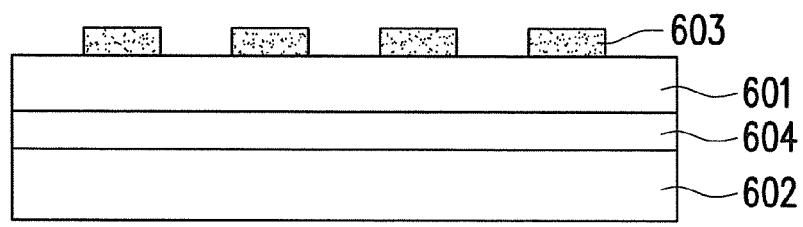
Figure 3C:
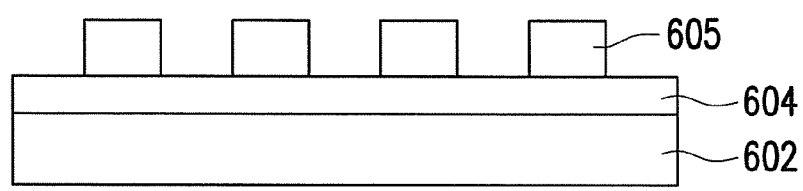

Referring to FIGS. 3B and 3C, a photolithography process is carried out to pattern the photoresist layer 601. Specifically, the photoresist layer 601 is covered by a mask layer 603 and then exposed to radiation such as UV light. After a development process, the unexposed portion of photoresist layer 601 is removed, leaving a patterned photoresist layer 605. The patterned photoresist layer 605 covers a portion of graphene layer 604 and exposes the other portion thereof.

Figure 3D:
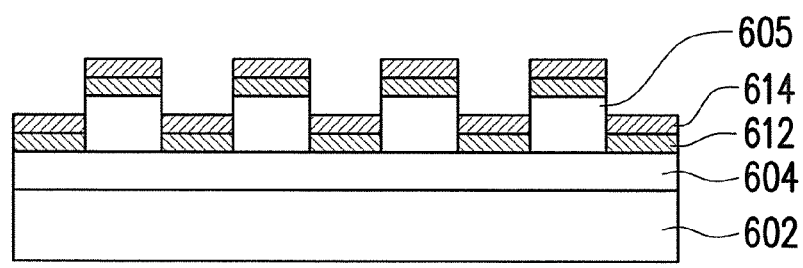

Referring to FIG. 3D, a catalyst layer 614 is framed on the graphene layer 604. The catalyst layer 614 can include iron (Fe), cobalt (Co), or Ni, for example. Optionally, to deposit the catalyst nanoparticles uniformly, a buffer layer 612 can be formed between the graphene layer 604 and the catalyst layer 614. In this embodiment, the catalyst layer 614 includes Fe while the buffer layer 612 includes Al. The thicknesses of the catalyst layer 614 and the buffer layer 612 can be 3 min or more and 25 or more, respectively.

Figure 3E:
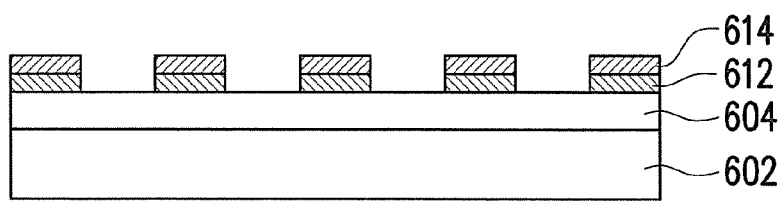

Referring to FIG. 3E, a lift-off process is carried out (e.g., by using acetone) to remove the patterned photoresist layer 605 as well as the catalyst layer 614 and buffer layers 612 thereon, with part of the catalyst layer 614 and the buffer layers 612 remaining intact on the graphene layer 604.

Figure 3F:
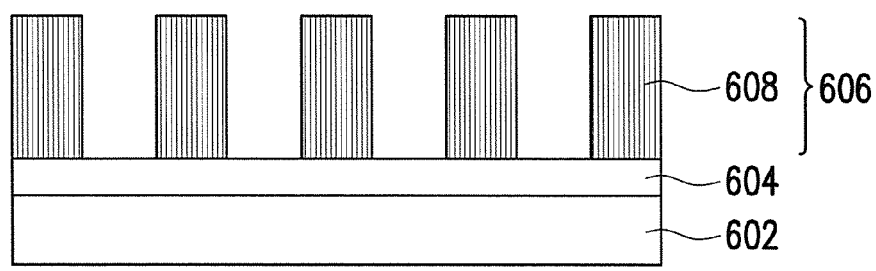

Referring to FIG. 3F, bundles 608's of aligned carbon nanotubes are grew on the graphene layer 604 at the position originally occupied by the remaining catalyst layer 614 and buffer layers 612, and collectively form a patterned layer 606 of aligned carbon nanotubes. The bundles 608's of aligned carbon nanotubes can be grew by a chemical vapor deposition process with $C_2H_2$ as the carbon source, for example. It should be noted that the catalyst layer 614 and the buffer layer 612 may not be necessarily exhausted, but they are typically consumed to a negligible extent.

Figure 3G:
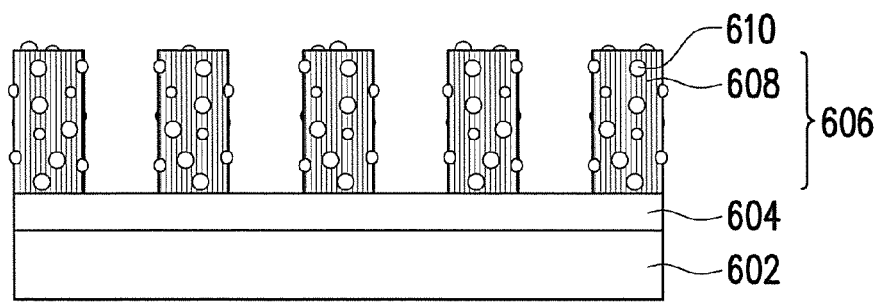

Referring to FIG. 3G, nano-particles 610's of a pseudocapacitive material are formed on the surface of the patterned layer 606 of aligned carbon nanotubes. The nano-particles 610's can be formed by a sputter technique, a metal-organic chemical vapor deposition (MOCVD) process, or an atomic layer deposition (ALD) process, for example. Other structures (e.g., nano-foil, nano-rod, nano-fiber, nano-flake, nano-sheet, or nano-needle) of the pseudocapacitive material may also be formed by the conventional techniques, and the details thereof are omitted for brevity.

The seventh embodiment of the present invention provides an electronic device, characterized in that the electrode of the electronic device includes any one of the abovementioned carbon nanotube-graphene composites. The electronic device can be a supercapacitor or a secondary battery (e.g., a lithium ion battery). In the case of supercapacitor, for example, by virtue of the high specific surface area of the carbon nanotubes and the unique electrochemical behaviour of the pseudocapacitive material, the charge storage capacity of the carbon nanotube-graphene composite can be greatly improved as compared to the conventional electrode, and, in turn, the power density of the supercapacitor can be considerably enhanced.

EXPERIMENTAL

The following section is presented for a better understanding of the present invention and to support an enabling disclosure. The experimental details, however, should not be construed to limit the scope of the present invention.

[Formation of Graphene]

Cu foils were placed into a quartz tube of a TCVD (thermal chemical vapor deposition) system. Ar and $H_2$ were introduced into the TCVD system at a flow rate of 200 sccm and 4.5 sccm, respectively. The furnace was preheated to 1000° C., and the Cu foils were annealed at this temperature for 60 minutes. Afterwards, as the carbon source, $CH_4$ with a flow rate of 8.7 sccm was introduced into the quartz tube for 15 minutes to synthesize graphene, while the temperature is maintained at 1000° C.

[Transfer of Graphene]

The as-prepared graphene/Cu sample was coated with a photoresist (PR) material on the graphene side using a spin-coater and then baked for 5 minutes. Then, the PR/graphene/Cu sample was immersed into a $FeCl_3$ solution to dissolve copper. The PR/graphene sample was subsequently transferred onto a glass substrate (15 mm×15 mm). Acetone was used to remove the PR, leaving an intact graphene layer on the glass substrate.

[Photolithography]

A photolithography process is carried out to define the growth position of aligned carbon nanotubes on the graphene layer. The process is generally similar to that described in connection to FIGS. 3A-3C. After the photoresist layer was formed on the graphene layer, the sample was pre-baked at 105° C. to strengthen the adhesion between the photoresist and the graphene. The exposure was carried out by using a UV exposure machine. After UV exposure, the samples were soaked in a developer solution for several second and cleaned in de-ionized water. The sample was then hard-baked at 120° C. to remove the residue solution and further strengthen the adhesion between the photoresist and the graphene layer.

[Deposition of Catalyst and Buffer Material]

The as-prepared sample was loaded into a chamber of an electron beam evaporator system. The electron gun was turned on while the chamber was evacuated to $5\times10^{-7}$ torr. A buffer layer (Al) was first deposited onto the graphene layer, and a catalyst layer (Fe) was subsequently deposited on the buffer layer. The thickness of the buffer layer and the catalyst layer are about 25 nm and 3 nm, respectively.

[Growth of Carbon Nanotubes]

The as-prepared Fe/Al/graphene/glass sample was placed into a chamber of a TCVD system. The chamber was pumped to achieve a pressure level of $2\times10^{-2}$ torr and heated up to 750° C. The sample was annealed at this temperature for 1.5 hours. After annealing, $C_2H_2$ was introduced with the working pressure maintained at 4 torr for 30 seconds to form aligned carbon nanotubes.

[Coverage of Pseudocapacitive Material]

Figure 4A:
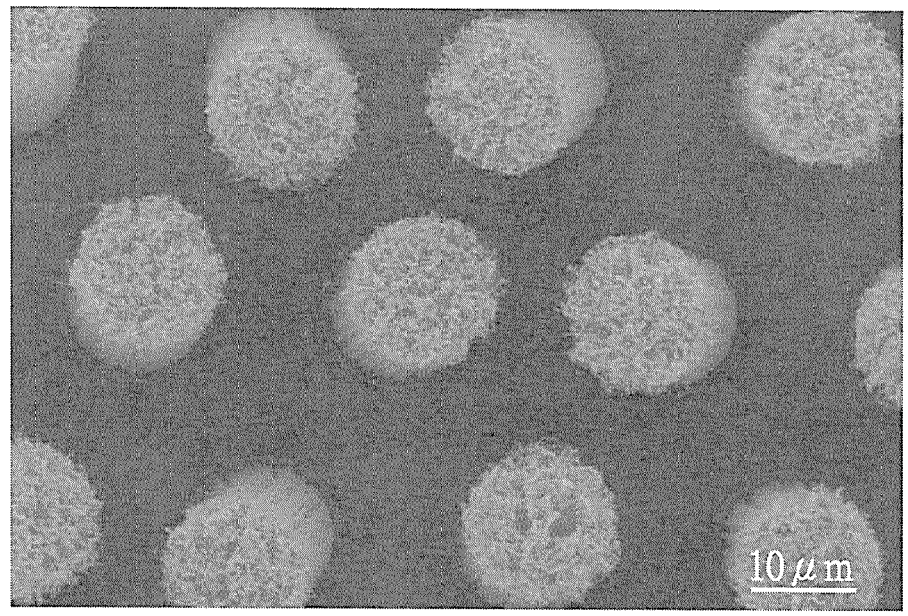
FIGS. 4A-4D show the SEM images of several examples of carbon nanotube-graphene composites.
Figure 4B:
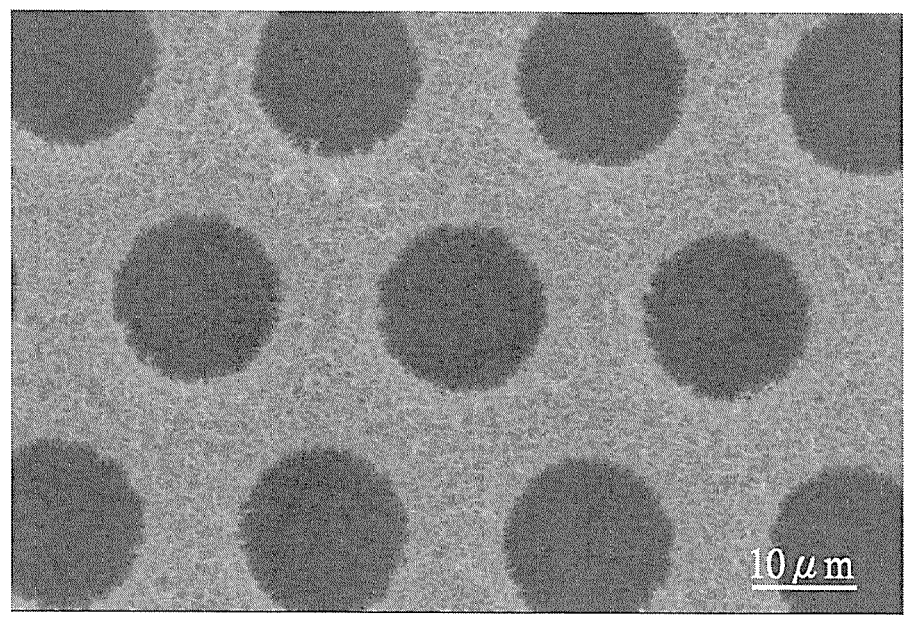

$RuO_2$ nanostructures were covered onto the carbon nanotubes using MOCVD under a pressure of 1.5 torr with precursor $((CH_3CH_2)C_5H_4)_2Ru$, while oxygen gas ($O_2$) was introduced at 20 sccm to carry the precursor into the chamber. The mixture of the precursor and $O_2$ are sprayed onto the substrate through a shower head for 2 hours. The temperature of the precursor, transport line, shower head, and substrate were 45° C., 80° C., 160° C., and 550° C., respectively. The as-made aligned carbon nanotubes covered with $RuO_2$ nanostructures are shown in FIGS. 4A and 4B, wherein samples in FIG. 4A corresponds to the embodiment shown in FIG. 1A, and samples in FIG. 4B corresponds to the embodiment shown in FIG. 1C.

Figure 4C:
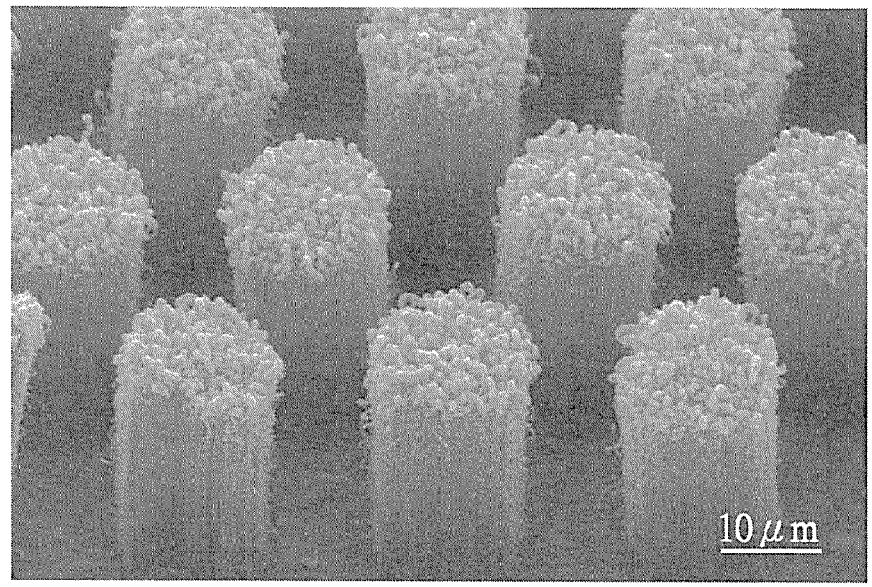
Figure 4D:
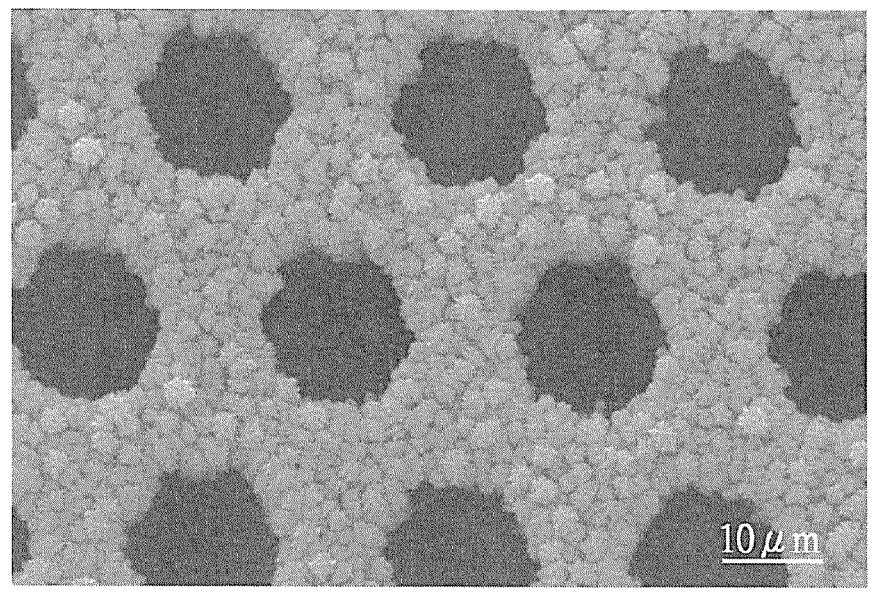

$IrO_2$ nano-foils were deposited onto the carbon nanotubes by a radio frequency magnetron sputtering (RFMS) process, with a 1.0 inch iridium ingot as the target. The RFMS chamber was evacuated to a base pressure of $2.25 \times 10^{-5}$ mtorr. $O_2$ and Ar with flow rates of 2 sccm and 15 sccm, respectively, were introduced into the chamber. During the sputtering process the chamber pressure was kept at 0.12 mtorr. The RF power was 30 W. The growth time was 60 minutes. The substrate temperature was 250° C. The as-made aligned carbon nanotubes covered with $IrO_2$ nano-foils are shown in FIGS. 4C and 4D, wherein samples in FIG. 4C corresponds to the embodiment shown in FIG. 1A, and samples in FIG. 4D corresponds to the embodiment shown in FIG. 1C.

[Electrochemical Characteristics]

The capacitance of samples of graphene-carbon nanotube composites measured by cyclic voltammetry at the scan rate of 0.05 V/s is presented in Table I. Further, it is found that the $RuO_2$ and $IrO_2$-coated graphene-carbon nanotube composites are nearly stable and suitable for over 1000 charge and discharge cycles.

TABLE I*

| Sample | | | |
|---|---|---|---|
| Sample | $CNTS_{D25W10}$ | $CNTS_{D10W10}$ | $CNTS_{D10W5}$ |
| C (F/g) | 2.4 | 3.2 | 7.1 |
| Sample | $CNTOS_{D25W10}$ | $CNTOS_{D10W10}$ | $CNTOS_{D10W5}$ |
| C (F/g) | 2.6 | 3.7 | 13.6 |
| Sample | $RuO_2CNTS_{D25W10}$ | $RuO_2CNTS_{D10W10}$ | $RuO_2CNTS_{D10W5}$ |
| C (F/g) | 48.1 | 60.4 | 89.3 |
| Sample | $RuO_2CNTOS_{D25W10}$ | $RuO_2CNTOS_{D10W10}$ | $RuO_2CNTOS_{D10W5}$ |
| C (F/g) | 53 | 94.5 | 95.9 |
| Sample | $IrO_2CNTS_{D25W10}$ | $IrO_2CNTS_{D10W10}$ | $IrO_2CNTS_{D10W5}$ |
| C (F/g) | 77.4 | 85.6 | 92.6 |
| Sample | $IrO_2CNTOS_{D25W10}$ | $IrO_2CNTOS_{D10W10}$ | $IrO_2CNTOS_{D10W5}$ |
| C (F/g) | 62.2 | 80.7 | 117 |

*Denotation of samples are defined, for example, as follows: "$CNTS_{D10W5}$" refers to a pristine aligned carbon nanotube array with structure corresponding to FIG. 1A, wherein "D10W5" means d = 10 μm and w = 5 μm; "$CNTOS_{D10W5}$," on the other hand, refers to a structure corresponding to FIG. 1C, wherein "D10W5" means the diameter of a hollow portion and the spacing between two hollow portions are 10 μm and 5 μm, respectively; "$RuO_2CNTS_{D10W5}$" simply refers to a $CNTS_{D10W5}$ sample coated with $RuO_2$.

The present invention has been disclosed above in the preferred embodiments, but is not limited thereto. It is known to persons skilled in the art that some modifications may be made without departing from the spirit and scope of the present invention. Therefore, the scope of the present invention should be defined by the following claims.

What is claimed is:

1. A method of forming a carbon nanotube-graphene composite, comprising:
   providing a graphene layer on a substrate; and
   forming a patterned layer of aligned carbon nanotubes on the graphene layer, wherein the forming of the patterned layer comprises:
      forming a photoresist layer on the graphene layer;
      patterning the photoresist layer to form a patterned photoresist layer, wherein the patterned photoresist layer covers a first portion of the graphene layer and exposes a second portion of the graphene layer; and
      growing aligned carbon nanotubes on the second portion of the graphene layer.

2. The method of claim 1, further comprising forming a catalyst layer on the graphene layer after patterning the photoresist layer and before growing the aligned carbon nanotubes.

3. The method of claim 2, further comprising forming a buffer layer on the graphene layer after patterning the photoresist layer and before forming the catalyst layer on the graphene layer.

4. The method of claim 1, further comprising forming a pseudocapacitive material on a surface of the patterned layer of aligned carbon nanotubes.

* * * * *